United States Patent
Collins, III et al.

(10) Patent No.: US 6,642,652 B2
(45) Date of Patent: Nov. 4, 2003

(54) PHOSPHOR-CONVERTED LIGHT EMITTING DEVICE

(75) Inventors: William David Collins, III, San Jose, CA (US); Michael R. Krames, Mountain View, CA (US); Godefridus Johannes Verhoeckx, Eindhoven (NL); Nicolaas Joseph Martin van Leth, Vallkenswaard (NL)

(73) Assignee: Lumileds Lighting U.S., LLC, San Jose, CA (US)

( * ) Notice: Subject to any disclaimer, the term of this patent is extended or adjusted under 35 U.S.C. 154(b) by 130 days.

(21) Appl. No.: 09/879,547

(22) Filed: Jun. 11, 2001

(65) Prior Publication Data

US 2002/0185965 A1 Dec. 12, 2002

(51) Int. Cl.[7] .............................. H01J 63/04; G09G 3/10
(52) U.S. Cl. ........................ 313/512; 313/498; 313/499; 313/506; 313/501; 315/169.3
(58) Field of Search ................................. 313/311, 498, 313/499, 501, 502, 503, 506, 507, 512, 113; 428/690, 917, 212; 315/169.3; 359/58, 60

(56) References Cited

U.S. PATENT DOCUMENTS

| | | | |
|---|---|---|---|
| 4,482,447 A | 11/1984 | Mizuguchi et al. | 204/181 |
| 5,296,117 A | 3/1994 | De Jaeger et al. | 204/181.5 |
| 5,813,753 A | 9/1998 | Vriens et al. | 362/293 |
| 5,952,681 A | 9/1999 | Chen | 257/89 |
| 5,998,925 A | * 12/1999 | Shimizu et al. | 313/503 |
| 6,090,434 A | 7/2000 | Sugiura et al. | 427/64 |
| 6,203,681 B1 | 3/2001 | Yang | 204/489 |
| 6,245,259 B1 | 6/2001 | Hohn et al. | 252/301.36 |
| 6,373,188 B1 | 4/2002 | Johnson et al. | 313/506 |
| 6,479,836 B1 | * 11/2002 | Suzuki et al. | 257/15 |

FOREIGN PATENT DOCUMENTS

| | | |
|---|---|---|
| WO | WO 97/48138 | 12/1997 |
| WO | WO 00/24024 | 4/2000 |

OTHER PUBLICATIONS

55–046407, Apr. 1, 1980, Patent Abstracts of Japan.
K. Murakami et al., "Compound Semiconductor Lighting Based on InGaN Ultraviolet LED and ZnS Phosphor System," 2000 IEEE International Symposium on Compound Semiconductors, 2000, pp. 449–454.

* cited by examiner

Primary Examiner—Nimeshkumar D. Patel
Assistant Examiner—Sharlene Leurig
(74) Attorney, Agent, or Firm—Patent Law Group LLP; Rachel V. Leiterman

(57) ABSTRACT

A light source is disclosed that includes a light emitting device such as a III-nitride light emitting diode covered with a luminescent material structure, such as a single layer or multiple layers of phosphor. Any variations in the thickness of the luminescent material structure are less than or equal to 10% of the average thickness of the luminescent material structure. In some embodiments, the thickness of the luminescent material structure is less than 10% of a cross-sectional dimension of the light emitting device. In some embodiments, the luminescent material structure is the only luminescent material through which light emitted from the light emitting device passes. In some embodiments, the luminescent material structure is between about 15 and about 100 microns thick. The luminescent material structure is selectively deposited on the light emitting device by, for example, stenciling or electrophoretic deposition.

28 Claims, 6 Drawing Sheets

PHOSPHOR-CONVERTED LIGHT EMITTING DEVICE

CROSS REFERENCE TO RELATED APPLICATION

This application is related to application Ser. No. 09/879,627, titled "Using Electrophoresis to Produce A Conformally Coated Phosphor-Coated Light Emitting Structure," by William David Collins III et al., filed concurrently and incorporated herein by reference.

BACKGROUND OF THE INVENTION

1. Field of the Invention

The present invention relates generally to light emitting devices and more particularly to light emitting devices using phosphors.

2. Description of Related Art

Blue light emitting diodes (LEDs) are used with luminescent materials (phosphors) to produce light emitting devices which emit apparently white light. U.S. Pat. Nos. 5,813,753 and 5,998,925, for example, disclose light emitting devices in which a blue LED is disposed in a reflective cup and surrounded by material including phosphors. FIG. 1 illustrates such a device. A portion of the blue light emitted by the LED is absorbed by the phosphors, which in response emit red and green light. The combination of the unabsorbed blue light emitted by the LED and the red and the green light emitted by the phosphors can appear white to the human eye.

Typically, light emitted from sources such as the device illustrated in FIG. 1 does not have a uniform color. Often, white light is emitted in a central cone surrounded by annular rings of yellow and blue light. This effect occurs because of a non-uniformity in the thickness of the phosphor-containing material surrounding the LED and consequent spatially non-uniform absorption of blue light and emission of red and green light. In particular, thick regions of phosphor containing material absorb more blue light and emit more red and green light than do thin regions of phosphor containing material. The light from thick regions thus tends to appear yellow, and the light from the thin regions tends to appear blue. As illustrated in FIG. 1, light emitted in path b travels much further through the phosphor than light emitted in path a. When light strikes a phosphor particle, the light is either absorbed and re-emitted at a different wavelength or scattered by the phosphor. Light that travels a longer distance through the phosphor is more likely to be absorbed and re-emitted. Conversely, light that travels a shorter distance through the phosphor is more likely to be scattered out of the device without being absorbed and re-emitted. As a result, more blue light is emitted from regions of the device corresponding to short path lengths through the phosphor and more red and green is emitted from regions of the device corresponding to long path lengths through the phosphor.

U.S. Pat. No. 5,959,316 to Lowery, incorporated herein by reference, proposes eliminating the non-uniformity in path length through the phosphor by depositing a transparent spacer over and around the LED prior to deposition of a uniform thickness of phosphor containing material, as illustrated in FIG. 2. However, surface tension makes the shape and thickness of the phosphor containing material, typically deposited as a liquid or paste (solids dispersed in a liquid), difficult to control. In addition, phosphor layer 66 must be separated from light emitting structure 60. As a result, the effective source size of the light, i.e. the light emitting structure and the phosphor layer, is much larger than the size of the light emitting structure itself. Since the optics used to control the light emitted from the source can grow geometrically with the source size, the large source size proposed by Lowery can present implementation difficulties.

SUMMARY

In accordance with one embodiment of the invention, a light source includes a light emitting device, such as a III-nitride light emitting diode, uniformly covered with a luminescent material structure, such as a single layer or multiple layers of phosphor. Any variations in the thickness of the luminescent material structure are less than or equal to 10% of the average thickness of the luminescent material structure. In some embodiments, the thickness of the luminescent material structure is less than 10% of a cross-sectional dimension of the light emitting device. In some embodiments, the luminescent material structure is the only luminescent material through which light emitted from the light emitting device passes. In some embodiments, the luminescent material structure is between about 15 and about 100 microns thick, preferably 15–35 microns thick. In some embodiments, the luminescent material structure includes multiple types of luminescent materials. In some embodiments, the luminescent material structure includes multiple thin layers of luminescent materials.

DETAILED DESCRIPTION

Figure 3:
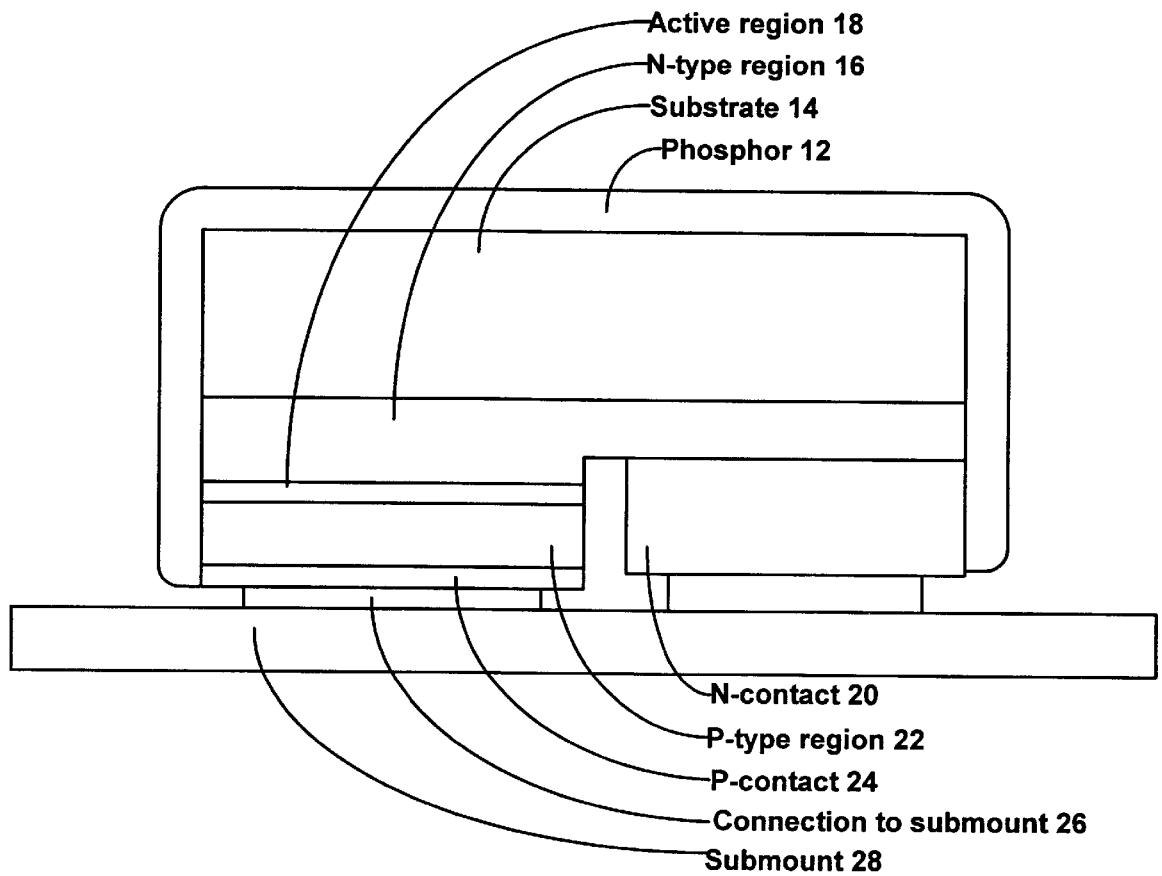
FIG. 3 illustrates an LED according to an embodiment of the present invention.

An LED coated with phosphor according to the present invention is illustrated in FIG. 3. As used herein, "phosphor" refers to any luminescent material which absorbs light of one wavelength and emits light of a different wavelength; "LED" refers to a stack of semiconductor layers formed on a substrate including an active region which is capable of emitting light, and contacts deposited on the semiconductor layers; and "source" refers to the combination of the LED and any luminescent materials, including phosphor layers that are not in direct contact with the LED, through which the light emitted from the LED passes. The LED in FIG. 3 includes a n-type region 16 formed on a substrate 14, such as sapphire, SiC, or a III-nitride material. An active region 18 is formed on the n-type region 16, and a p-type region 22 is formed on the active region 18. N-type region 16, active region 18, and p-type region 22 are typically multiple-layer structures of materials having the general formula $Al_xGa_yIn_{1-x-y}N$ ($0 \leq x \leq 1$, $0 \leq y \leq 1$, $0 \leq x+y \leq 1$), may further contain group III elements such as boron and thallium, and in which some of the nitrogen may be replaced by phosphorus, arsenic, antimony, or bismuth. A portion of the p-type region 22, the active region 18, and the n-type region 16 is etched away to expose a portion of n-type region 16. A p-type contact 24 is deposited on the p-type region 22 and an n-type contact 20 is deposited on the exposed portion of n-type region 16. The LED is then flipped over and mounted to a submount 28 by a material 26 such as solder. Though a flip-chip LED is shown in FIG. 3, the invention is not limited to flip chip devices and may be used with other LED geometries as well. The LED emits light, for example, in the UV through blue portion of the electromagnetic spectrum.

Luminescent material structure 12 has a substantially uniform thickness above the top surface and adjacent to the vertical sides of the LED. In one embodiment, any variations in the thickness of luminescent material structure 12 are less than 10% of the thickness of luminescent material structure 12, and frequently less than 5% of the thickness of luminescent material structure 12. Thus, every light path out of luminescent material structure 12 has substantially the same length, reducing non-uniformity in the color of light emitted from the source. The thickness of luminescent material structure 12 is about 15 microns ($\mu$m) to about 100 $\mu$m. Luminescent material structure 12 may be multiple thin layers of the same or different luminescent materials, and may also include particles which do not appreciably absorb or emit light.

Luminescent material structure 12 is close enough to the LED, and thin enough relative to the LED dimensions, that it does not significantly increase the size of the source over the size of the LED. Typically, luminescent material structure 12 is adjacent to the LED. In one embodiment, the thickness of luminescent material structure 12 is less than 10% of a cross sectional dimension of the LED, e.g., the length of the LED. A typical cross sectional dimension of an LED is 1 mm. Thus, a phosphor-coated LED according to embodiments of the present invention does not require optics substantially larger than optics required to control the light out of an LED that is not phosphor coated.

In order to maintain uniformity of the path length through the phosphor, and therefore of the color of light emitted from the source, luminescent material structure 12 should be the only phosphor path through which light from the LED passes. Any phosphor coatings on submount 28 of FIG. 3, or on any optics such as reflector cups or reflecting planes which extend the phosphor layer to greater than 10% of a cross sectional dimension of the LED or greater than 100 microns, whichever is larger, are avoided.

In some embodiments, the luminescent material structure is one or more layers of the same or different phosphor materials. The phosphor material layers may include transparent encapsulating materials such as silicone gel, sol-gel, and glass. The use of sol-gel as an encapsulating material is described in more detail in application Ser. No. 09/879,548, titled "Light-Emitting Device and Production Thereof, filed on the same day as the present application, and incorporated herein by reference. The transparent encapsulating materials may help bind the phosphor layer together and to the LED. The transparent encapsulating materials may also reduce the refractive index step between the LED and phosphor particles and between the phosphor particles themselves to increase photon escape angle and increase extraction efficiency.

The phosphor-converted source described above may be formed by, for example, stenciling, vacuum coating, spray-powder coating, electrostatic deposition, or electrophoretically depositing a uniform phosphor layer on an LED. Stenciling and electrophoretic deposition are described below. Stenciling is described in more detail in application Ser. No. 09/688,503, filed on Oct. 13, 2000, titled "Stenciling Phosphor Layers on Light Emitting Diodes," and incorporated herein by reference.

Figure 1:
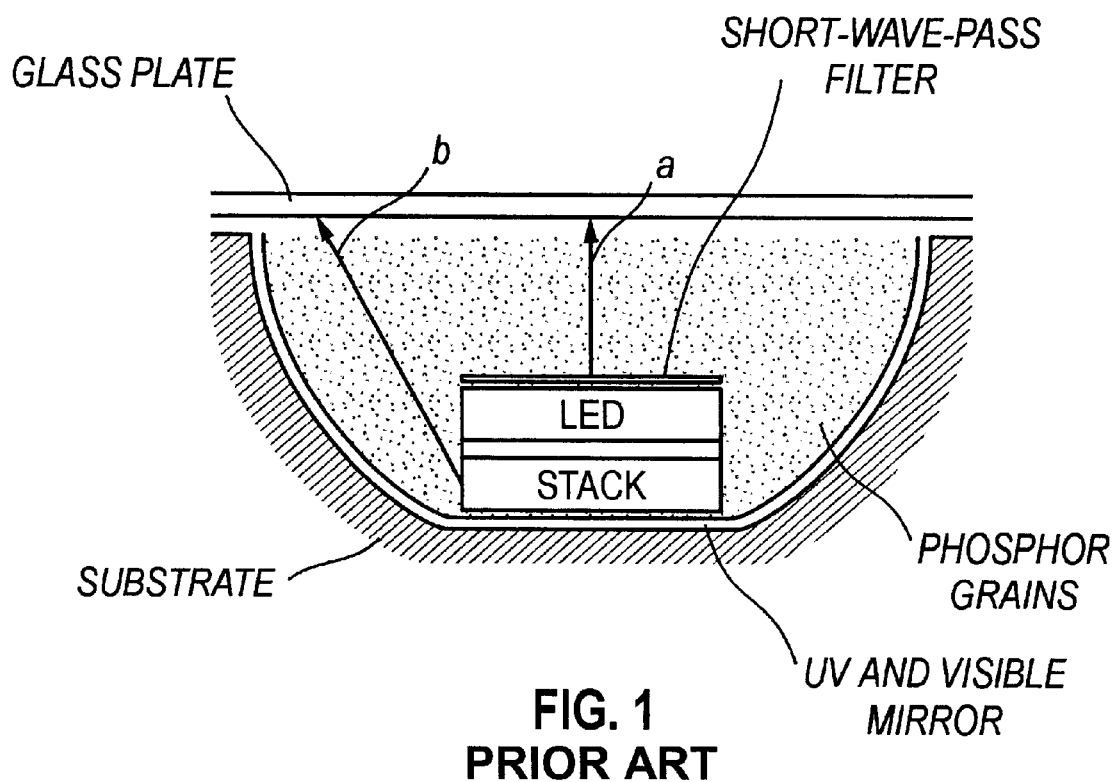
FIG. 1 illustrates an LED encapsulated in a material containing phosphor.
Figure 2:
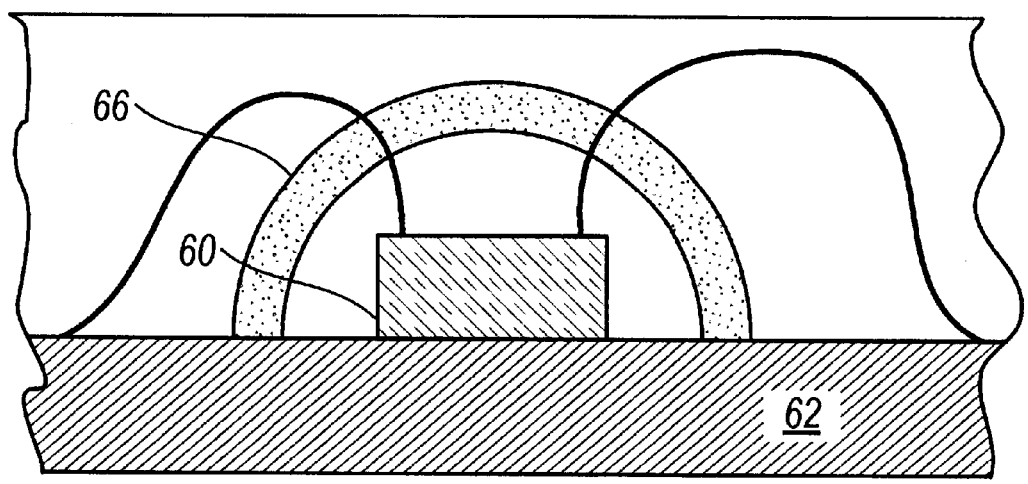
FIG. 2 illustrates an LED separated from a phosphor layer by a transparent spacer.
Figure 4:
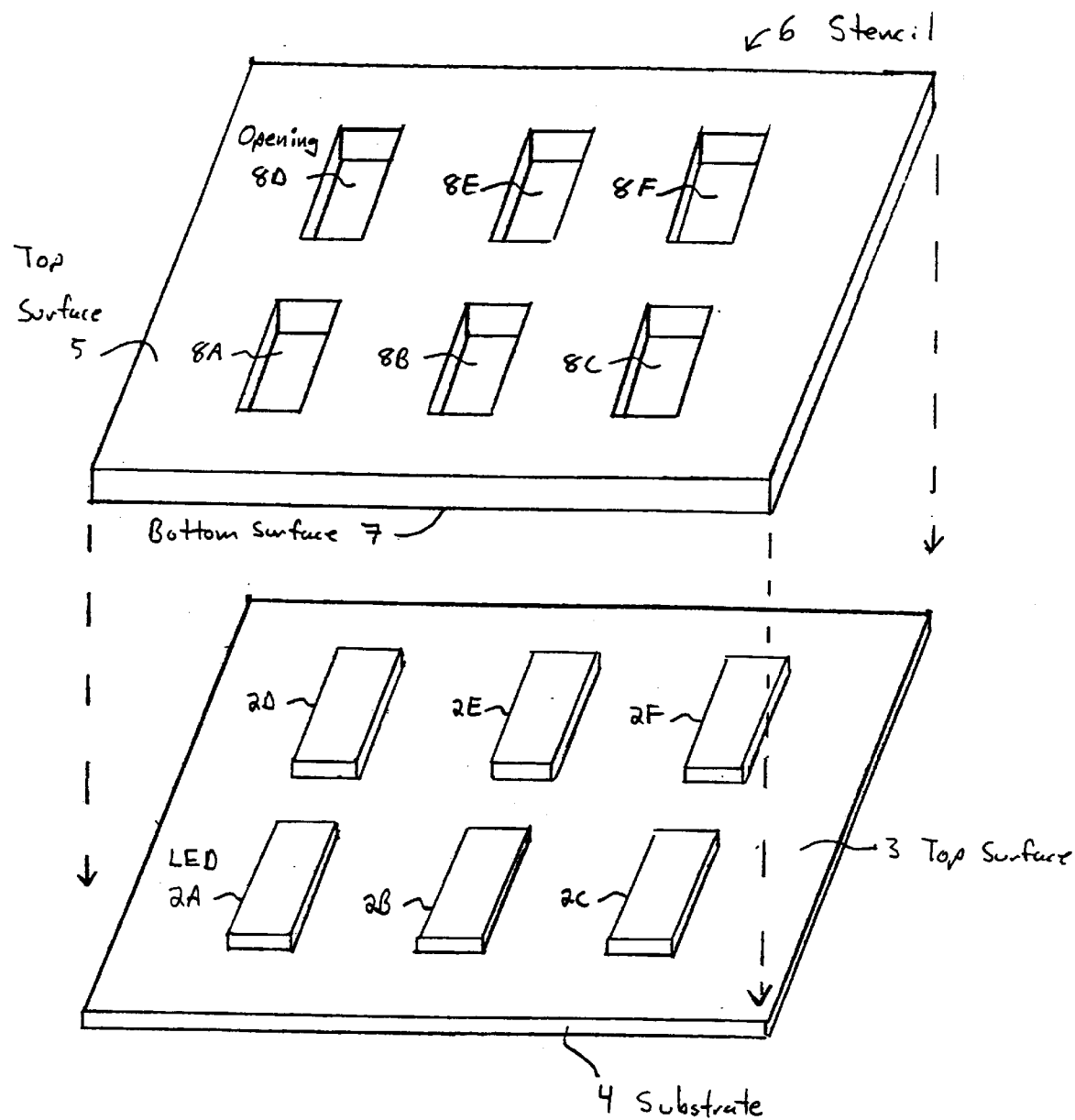
FIGS. 4, 5A, 5B, and 5C illustrate stenciling a layer of phosphor material on an LED.
Figure 5A:
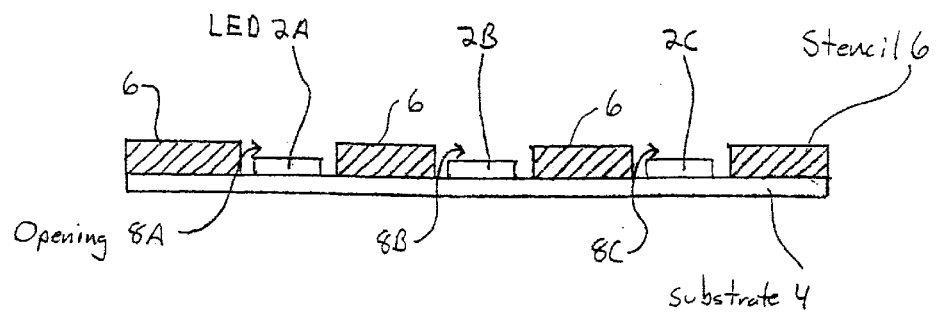
Figure 5B:
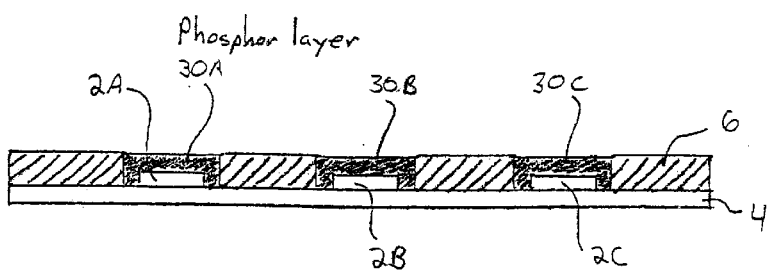
Figure 5C:
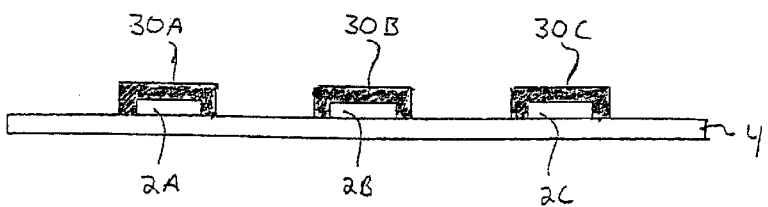

Stenciling is described in reference to FIGS. 4, 5A, 5B, and 5C. Referring now to FIG. 4, LEDs 2A–2F are disposed in a pattern on a top surface 3 of substrate 4. Though for clarity of illustration 6 LEDs are depicted in FIG. 1, more or fewer than 6 LEDs may be disposed on substrate 4. Stencil 6 has a top surface 5, a bottom surface 7, and openings 8A–8F passing through stencil 6 and corresponding in shape to LEDs 2A–2F. In one implementation, openings 8A–8F are distributed in stencil 6 in a pattern corresponding to the pattern of LEDs 2A–2F on substrate 4. In another implementation, the number of openings in stencil 6 is greater than the number of LEDs on substrate 4, and a subset of the openings in stencil 6 is distributed in a pattern corresponding to the pattern of LEDs 2A–2F. Stencil 6 is formed, for example, from a stainless steel sheet. The thickness of stencil 6 measured perpendicular to its planar surfaces (depth of openings 8A–8F) is equal to the sum of the height of an LED 2A–2F measured perpendicular to substrate 4 and the approximate desired thickness of a luminescent material to be disposed above LEDs 2A–2F. Similarly, the length or width of an opening 8A–8F is equal to the sum of the corresponding length or width of an LED 2A–2F and approximately twice the desired thickness of luminescent material to be disposed around LEDs 2A–2F.

Stencil 6 is positioned on substrate 4 such that openings 8A–8F are aligned with LEDs 2A–2F and bottom surface 7 of stencil 6 is in contact with top surface 3 of substrate 4. As shown in the side view of stencil 6 positioned on substrate 4 illustrated in FIG. 5A, LEDs 2A–2C, for example, are located approximately centered in corresponding openings 8A–8C in stencil 6. Next, a curable luminescent stenciling composition, such as the phosphor containing stenciling composition described below, is disposed in openings 8A–8F in stencil 6. In one implementation, the stenciling composition is disposed in openings 8A–8F of stencil 6 with a metal blade drawn across surface 5. Stencil 6 is then removed from substrate 4, leaving stenciled phosphor layers, such as phosphor layers 30A–30C illustrated in FIGS. 5B and 5C, disposed over and around LEDs 2A–2F.

The steps of positioning stencil 6 on substrate 4, disposing a luminescent stenciling composition on surface 5 and in openings 8A–8F to form phosphor layers such as phosphor layers 30A–30C on LEDs 2A–2F, and removing stencil 6 from substrate 4 may be performed by a conventional high precision stenciling machine typically used to stencil solder paste onto printed circuit boards. The stenciling machine is, for example, an Ultraprint 1500 manufactured by MPM Corporation of Franklin, Mass.

After stencil 6 is removed from substrate 4, the luminescent material layers on LEDs 2A–2F are cured to a solid state by, for example, application of heat or ultraviolet radiation. The curing process can involve, for example, cross-linking of polymeric material in the phosphor layers. LEDs 2A–2C, for example, are heated to about 100° C. in a conventional oven for about 10 minutes to cure phosphor layers 30A–30C.

The luminescent material layers on LEDs 2A–2F must substantially retain their stenciled shapes, without collapsing or slumping, until cured. In addition, it is desirable that the luminescent material layers withstand operating temperatures exceeding about 120° C. for long periods of time without change in their chemical or physical properties.

Epoxies, urethanes, and similar organic resins, for example, are unsuitable for use in the phosphor layers, because at temperatures exceeding about 120° C. they oxidize and become yellow. The yellow organic resins then absorb blue light emitted from the LED, degrading the performance of the device. The apparent color of a device intended to emit white light, for example, would shift toward yellow as the organic resins oxidized, and the efficiency would drop dramatically as the blue light is absorbed by the yellowed resins, not by the luminescent materials.

A luminescent stenciling composition suitable for use in accordance with an embodiment of the present invention is prepared as follows. First, a phosphor powder is mixed with a conventional curable silicone polymer composition. The curable silicone polymer composition includes at least one polymer having a chemical structure that includes alternating silicon and oxygen atoms (a silicone polymer), and optionally includes a curing agent such as a catalyst that catalyzes cross-linking of silicone polymers or a photopolymerization initiator. The curable silicone polymer composition is preferably substantially nonabsorbing and nonscattering (optically clear) for wavelengths of light from about 350 nm to about 800 nm. The uncured stenciling composition should have a viscosity greater than about 1,000 centistokes if it is to retain its stenciled shape until it is cured, and if the phosphor particles are to remain in suspension rather than sediment out, but less than about 20,000 centistokes if it is to be easily stenciled. Consequently, the curable silicone polymer composition preferably has a viscosity, before curing, of about 1,000 centistokes to about 20,000 centistokes. In addition, the curable silicone polymer composition preferably has a refractive index greater than about 1.45, in order to increase the efficiency with which light is coupled out of the LED and out of the phosphor particles into the stenciling composition. Also, the curable silicone polymer composition is preferably stable as a liquid at room temperature until cured to a solid state by, for example, heating or exposure to ultraviolet light.

Suitable curable silicone polymer compositions are commercially available. In one implementation, for example, the curable silicone polymer composition is a conventional two part thermally curable silicone polymer composition, available from Nye Lubricants, Inc. of Fairhaven, Mass., having a viscosity of about 1300 centistokes and curing in about 10 minutes at 100° C. and in about two weeks at room temperature.

In one implementation, the phosphor powder mixed with the conventional curable silicone composition is a powder of $(Y,Gd)_3Al_5O_{12}$:Ce (gadolinium and cerium doped yttrium aluminum garnet) particles available as product number QUMK58/F from Phosphor Technology Ltd., Nazeing, Essex, England. Particles of this phosphor material have a typical diameter of about 5 microns ($\mu$m), range from 1 to 10 $\mu$m, absorb light of wavelengths from about 430 nanometers (nm) to about 490 nm, and emit light in a broad band from about 510 nm to about 610 nm. The color of light emitted by an LED having a stenciled phosphor layer is determined, in part, by the concentration of phosphor particles in the luminescent stenciling composition. Typically, the phosphor particles are mixed with the curable silicone polymer composition at concentrations ranging from about 20 grams of phosphor particles per 100 grams of silicone polymer composition to about 120 grams of phosphor particles per 100 grams of silicone polymer composition.

In one embodiment or titanium dioxide particles are also dispersed in the silicone polymer composition at a concentration of about 1.5 grams of titanium dioxide per 100 grams of silicone polymer composition to about 5.0 grams of titanium dioxide per 100 grams of silicone polymer composition. The titanium dioxide particles, which are approximately the same size as the phosphor particles, increase the scattering of light emitted by active region 14 and thus increase the absorption of that light by the phosphor particles. The overall conversion efficiency of the LED declines, however, with increasing titanium oxide concentration.

Next, after the phosphor particles and optional titanium dioxide particles are mixed with the curable silicone composition, finely divided silica particles are dispersed in the mixture to form a thixotropic gel. A thixotropic gel exhibits thixotropy, i.e., an apparent drop in viscosity when subjected to shear and a return to the original viscosity level when the shear force is removed. Consequently, a thixotropic gel behaves as a fluid when shaken, stirred, or otherwise disturbed and sets again to a gel when allowed to stand. Thus, a luminescent stenciling composition prepared in accordance with an embodiment of the present invention behaves as a fluid as it is stenciled onto an LED, but forms on the LED a phosphor containing layer that, if undisturbed, retains its shape after the stencil has been removed.

In one embodiment, the silica particles are particles of fumed silica, a colloidal form of silica made by combustion of chlorosilanes in a hydrogen-oxygen furnace. Fumed silica is chemically and physically stable at temperatures exceeding 120° C., transparent to visible light, and will impart satisfactory thixotropic properties to the luminescent stenciling composition at comparatively low concentrations. The grade of fumed silica used is chosen to be compatible with non-polar materials. In one implementation, the fumed silica is M-5P grade CAB-O-SEL® untreated amorphous fumed silica obtained from Cabot Corporation of Boston, Mass. This grade of fumed silica is hydrophobic and has an average surface area per unit mass of 200±15 $m^2$/g. The M-5P grade fumed silica particles are dispersed in the mixture of phosphor particles and silicone polymer composition with a conventional three roll mill at concentrations of about 1.5 grams of fumed silica per 100 grams of silicone polymer composition to about 4.5 grams of fumed silica per 100 grams of silicone polymer composition. As the concentration of fumed silica is increased, the stenciling composition becomes more thixotropic, i.e., more solid-like as an undisturbed gel.

Other implementations use fumed silica having a surface area per unit mass either greater than or less than 200±15 $m^2$/g. For fixed concentrations of fumed silica, stenciling compositions become more thixotropic as the surface area per unit mass of the fumed silica is increased. Thus, fumed silicas having lower surface area per unit mass must be used at higher concentrations. The required high concentrations of low surface area per unit mass fumed silicas can result in stenciling compositions having viscosities that are too high to be easily stenciled. Consequently, the fumed silica preferably has a surface area per unit mass greater than about 90 $m^2$/g. In contrast, as the surface area per unit mass of the fumed silica is increased, the required concentration of fumed silica decreases, but the fumed silica becomes more difficult to disperse in the silicone polymer composition.

Luminescent material structure 12 of FIG. 3 can also be deposited electrophoretically, as described below. In order to electrophoretically deposit a phosphor layer, an electroconductive layer is formed between the LED and the phosphor layer, the electrical conductivity X of which is chosen to be such that, during operation of the LED, the current through the electroconductive layer is at most 5% of the current through the semiconductor layers of the LED.

In practice, the conductive layer usually connects the contacts of the LED to each other. The electric conductivity of this layer is chosen to be so low that the layer does not cause a short-circuit between the contacts of the LED and does not significantly adversely affect the functioning of the LED or the efficiency with which light is generated. The electric conductivity of this layer is chosen to be high enough to serve as an electrode when depositing phosphor material from a suitably chosen suspension by means of electrophoresis. In this manner, a closely contacting uniform thickness phosphor layer can be readily formed over all the surfaces of the LED.

Typically, the electroconductive layer is formed of a material transparent to the light generated by the LED, such as a transparent oxide such as indium tin oxide, antimony tin oxide and tin oxide, or a suitable transparent organic conductive material.

Figure 6:
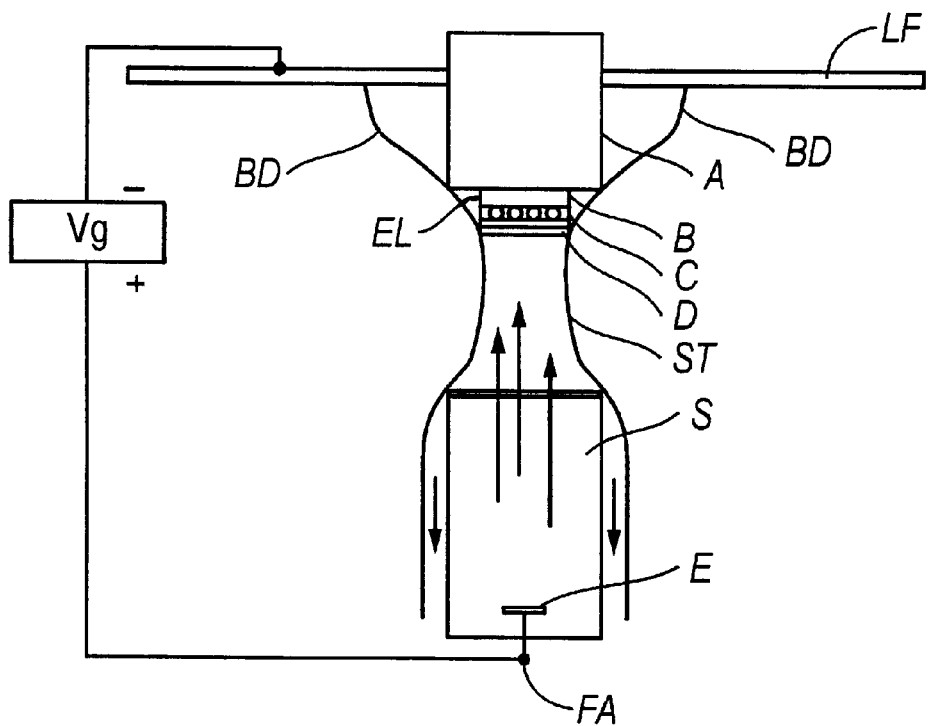
FIGS. 6 and 7 illustrate electrophoretic deposition of a layer of phosphor material on an LED.
Figure 7:
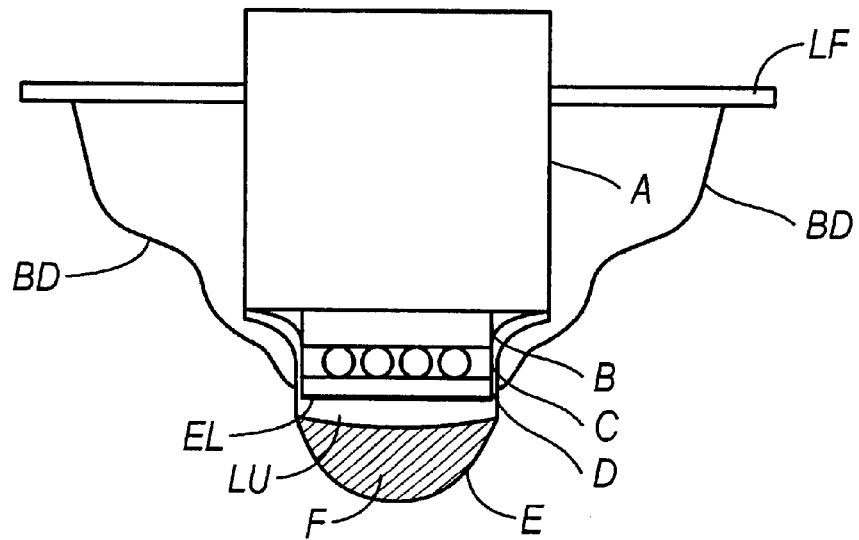

Electrophoretic deposition of phosphor layers is described in more detail in reference to FIGS. 6 and 7. In FIG. 6, LF denotes an insulating carrier plate incorporating electroconductive leadframe material. 'A' denotes an assembly including a heat sink, often made of a metal, provided in a hole in the insulating carrier plate LF. On assembly A is provided a submount B, often composed of an oxidized silicon chip patterned with aluminum. Ends of the submount B are connected to respective bonding wires, which are each connected to the carrier plate LF. D denotes an LED, which comprises a substrate on which a number of epitaxial layers of semiconductor materials are provided, as described above. C denotes solder balls forming electric contacts between LED D and submount B. ST denotes a droplet of a suspension S containing a luminescent material. The droplet ST is in contact with a part of the surface of the heat sink in assembly A, submount B, contacts C and LED D. The part of the surface of heat sink A, submount B, contacts C, bondwires BD, and LED D contacting the suspension is provided with an electroconductive layer EL, the electric conductivity of which is chosen to be higher than that of the suspension. The suspension is displaced by means of a pump in a direction indicated by means of the arrows, so that the part of the suspension that is near to the surface of the LED D is renewed continuously. A cathode of a voltage source $V_g$ is connected via the carrier plate LF and via the bonding wires BD to the electroconductive layer, so that this layer forms a cathode which is in contact with the suspension. An anode of voltage source $V_g$ is connected to an electrode E placed in the suspension. Under the influence of a voltage V generated by the voltage source, a layer of a luminescent material is deposited by means of electrophoresis on all surfaces in electrical contact with both the suspension and the electroconductive layer.

In the method shown in FIG. 6, the electroconductive layer is made of antimony tin oxide and has a thickness of approximately 50 nm. This electroconductive layer is provided by moistening the surface of the optoelectric element with a suspension containing antimony tin oxide. The LED comprises a sapphire substrate on which epitaxial layers of III-nitride materials are formed. The luminescent suspension used contains phosphors such as strontium sulfide, strontium thiogallate, yttrium aluminum garnet doped with gadolinium, cerium, and praseodymium, or the materials described above in reference to the discussion of stencil printing of luminescent materials. The electric conductivity of such suspensions is approximately 300 pS/m. It has been found that, under the influence of a voltage of 200 volts, the surface of the LED D is electrophoretically covered with a luminescent layer approximately 50 $\mu$m thick in 50 seconds.

In FIG. 7, parts corresponding to parts shown in FIG. 6 bear the same reference numerals. The electroconductive layer EL covers the surface of the heat sink in assembly A, submount B, contacts C and LED D. The electric layer EL in turn is completely covered with a luminescent layer LU. As a result, not only the surface of the LED D facing away from the heat sink is covered with luminescent material but also the side surfaces extending perpendicularly thereto. To influence the direction in which the light generated by the luminescent layer is emitted, a body in the form of a hemisphere is provided on the LED D, which hemispherical body is provided with a wall E which is transparent to visible light, and with a filling F which is also transparent to visible light. If a voltage is applied between the ends of the bonding wires contacting the carrier plate LF, the LED D generates electromagnetic radiation of a first wavelength range, which is converted by the luminescent layer LU to visible light of a different wavelength range. By virtue of the presence of the wall E and the transparent filling F, the light issues substantially in the direction of the longitudinal axis of the optoelectric element.

In order to achieve the best results using the electrophoretic process described above, the LED must be conductive such that phosphor is deposited on the LED, and the submount on which the LED is mounted must be poorly conductive or insulating, such that no phosphor is deposited on the submount. Thus, LED/submount combinations with an insulating LED substrate and/or a conducting submount may require more processing steps than LED/submount combinations without insulating LED substrates and/or conducting submounts.

In order to form electroconductive layer EL on an insulating LED to facilitate electrophoretic deposition, the LED is dipped in a suspension containing the electroconductive material, as described above. The dipping operation typically results in some or all of the submount being coated with electroconductive material. Since the submount is now conductive, the submount must be shielded from deposition of phosphor as described below in reference to FIGS. 8 and 9.

If the LED is fabricated on an electrically conductive substrate, such as SiC, the LED is not dipped in the electroconductive material suspension since no further electroconductive layer is required, hence the insulating layers on the submount are left insulating. Since the submount is insulating or poorly conducting, luminescent material is not deposited on the submount during the above-described electrophoretic deposition.

Figure 8:
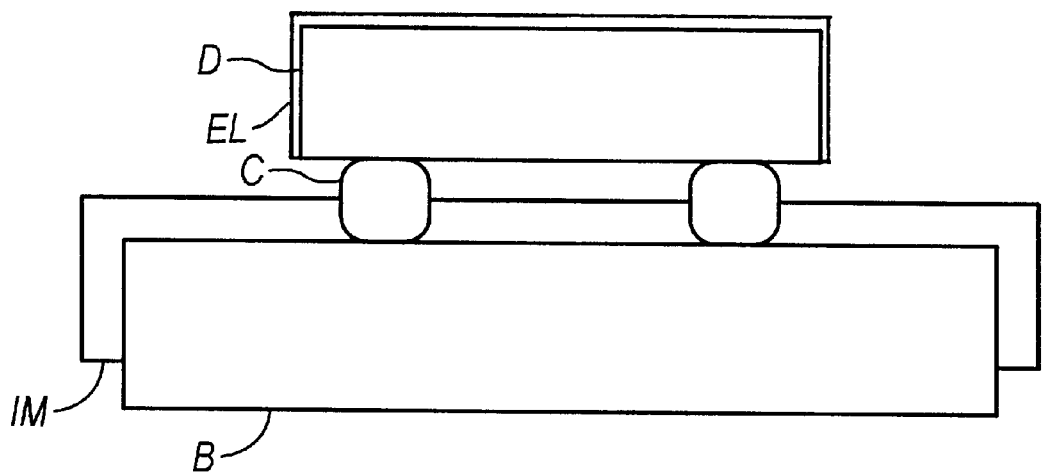
FIG. 8 illustrates an LED mounted on a masked conducting submount.

FIG. 8 illustrates an LED D, either formed on a conductive substrate or rendered conductive by optional transparent electroconductive coating EL prior to mounting to the substrate, mounted to a conducting submount B by connectors C, such as solder bumps. Before mounting LED D to submount B, submount B is first coated with an insulating material IM in all areas where light from LED D can impinge on submount B. Insulating material IM is then patterned to open holes where connectors C connect LED D and submount B. As a result of insulating material layer IM, submount B is not coated with luminescent material during electrophoretic deposition of the luminescent material. Examples of insulating coating materials appropriate for use as layer IM include, but are not limited to, inorganic coatings such as $Si_xN_y$, $Si_xO_y$, and $Al_xO_y$, and organic layers such as polyimide, teflon, nylon, cyclic-olefin copolymers, and PMMA.

Figure 9:
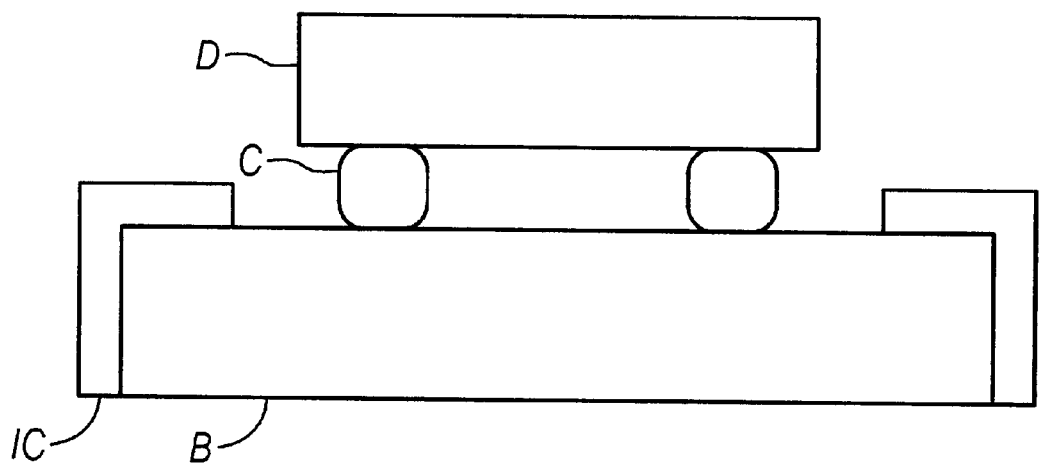
FIG. 9 illustrates an LED mounted on a capped conducting submount.
Figure 4:
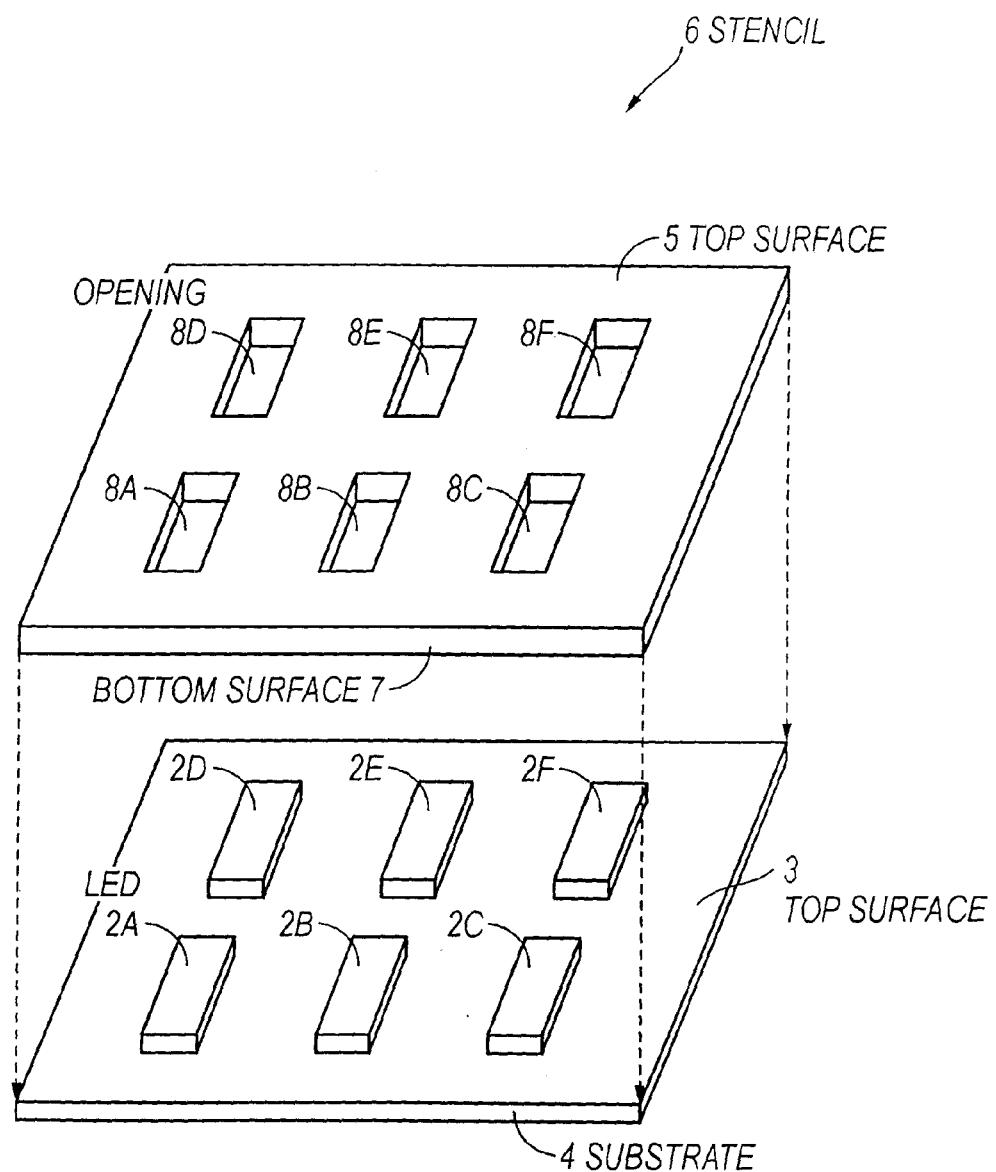
Figure 5A:
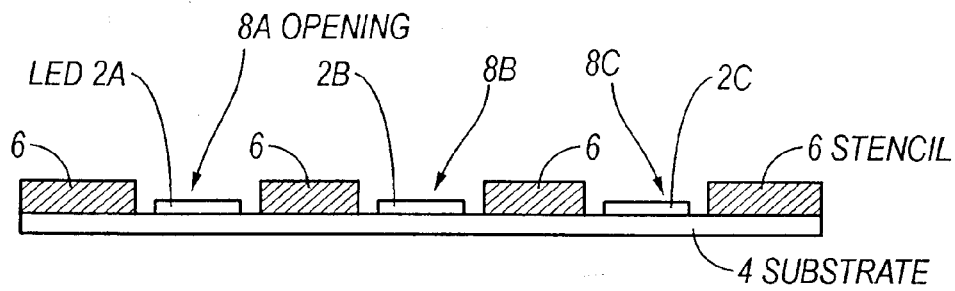
Figure 5B:
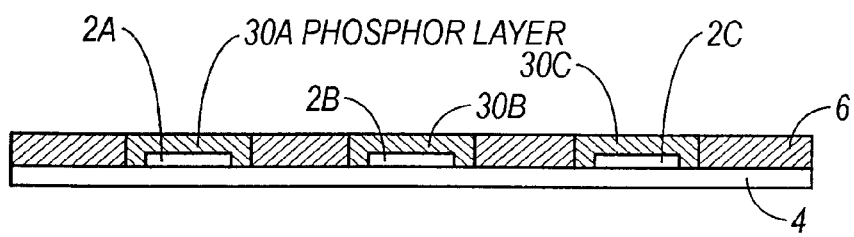
Figure 5C:
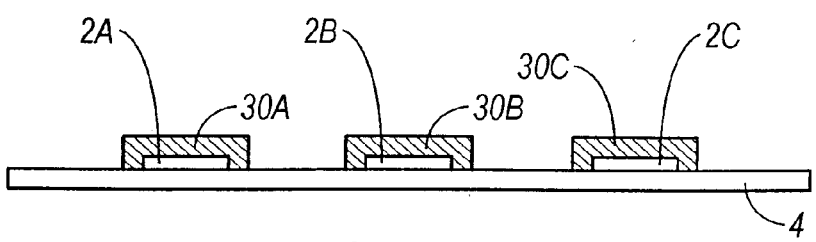

FIG. 9 also illustrates an LED D mounted to a conducting submount B by connectors C, such as solder bumps. Submount B is capped with an insulating cap IC. Insulating cap IC may be, for example, a plastic cap. Insulating cap IC is manufactured to provide the smallest possible hole that allows effective connection of LED D to submount B. Luminescent material is not deposited on insulating cap IC during electrophoretic deposition, but it may be deposited on any exposed parts of submount B between insulating cap IC, LED D, and the area where wires or connectors C attach. The distance between the inner edge of insulating cap IC and the portion of the submount covered by or underlying LED D should be less than or equal to 10% of the length of a side of LED D or less than or equal to 100 microns, whichever measurement is largest.

White light may be obtained by: 1) a blue light source energizing a phosphor that converts a portion of the blue light to yellow light; 2) a blue light source energizing phosphors that convert a portion of the blue light to red and green light; and 3) a UV light source energizing phospors to emit suitable combinations of blue, red, green, or yellow light.

The light sources described above may be attached to a reflective member underlying the LED. The reflective member may be convex, concave, or planar.

While particular embodiments of the present invention have been shown and described, it will be obvious to those skilled in the art that changes and modifications may be made without departing from the invention in its broader aspects and, therefore, the appended claims are to encompass within their scope all such changes and modifications as fall within the true spirit and scope of this invention.

What is claimed is:

1. A light source comprising:
   a light emitting device, the light emitting device comprising a stack of semiconductor layers including an n-type region, an active region, and a p-type region; and
   a luminescent material structure covering the light emitting device, wherein any variation in a thickness of the luminescent material structure is less than or equal to 10% of an average thickness of the luminescent material structure.

2. The light source of claim 1 wherein any variation in the thickness of the luminescent material structure is less or equal to 5% of an average thickness of the luminescent material structure.

3. The light source of claim 1 wherein the average thickness of the luminescent material structure is about 15 microns to about 100 microns.

4. The light source of claim 1 wherein the thickness of the luminescent material structure is less than or equal to the larger of 100 microns and 10% of a cross-sectional dimension of the light emitting device.

5. The light source of claim 1 wherein the luminescent material structure comprises a plurality of phosphor layers.

6. The light source of claim 1 wherein the light emitting device is a III-nitride device.

7. The light source of claim 1 wherein the luminescent material structure comprises a layer selected from the group consisting of yttrium aluminum garnet doped with gadolinium, cerium, and praseodymium; strontium sulfide; and strontium thiogallate.

8. The light source of claim 1 wherein the luminescent material structure comprises a material selected from the group consisting of silicone polymer and glass.

9. The light source of claim 1 wherein the luminescent material layer comprises silica particles.

10. The light source of claim 1 wherein the light emitting device further comprises a transparent electroconductive layer disposed between the luminescent material structure and the light emitting device.

11. The light source of claim 10 wherein the electroconductive layer comprises a transparent metal oxide.

12. The light source of claim 1 wherein the luminescent material layer covering the light emitting device is the only luminescent material layer through which light emitted from the light emitting device passes.

13. The light source of claim 1 wherein the layer of luminescent material emits light, such that when combined with light emitted by said light emitting device, the light source generates white light.

14. The light source of claim 1 wherein the layer of luminescent material comprises phosphors that emit red and green light when energized by light emitted by the light emitting device.

15. The light source of claim 1 wherein the layer of luminescent material comprises one or more phosphors that emit yellow light when energized by light emitted by the light emitting device.

16. The light source of claim 1 further comprising a submount connected to the light emitting device by connectors.

17. The light source of claim 16 wherein the submount comprises a conducting material, the light source further comprising a layer of poorly-conducting material coating a portion of the submount.

18. The light source of claim 16 wherein a portion of the luminescent material layer covers a first portion of the submount, an outer edge of the first portion of the submount being located within 100 microns of a second portion of the submount underlying the light emitting device.

19. The light source of claim 1 wherein the luminescent material layer comprises a plurality of sublayers of luminescent material.

20. The light source of claim 19 wherein a first sublayer has a different composition than a second sublayer.

21. The light source of claim 1 further comprising a reflective member underlying the LED.

22. The light source of claim 21 wherein the reflective member has a shape selected from the group consisting of planar, convex, and concave.

23. The light source of claim 1 wherein the LED emits light in the UV through blue portion of the electomagnetic spectrum.

24. The light source of claim 1 wherein the luminescent material structure comprises a plurality of phosphor types.

25. The light source of claim 1 wherein the luminescent material structure covers top and side surfaces of said light emitting device, a bottom surface of said light emitting device not being covered.

26. The light source of claim 1 wherein the light emitting device further comprises growth substrate and wherein the light emitting device is oriented such that light generated by the active region is extracted through the growth substrate.

27. The light source of claim 26 wherein the luminescent material structure overlies at least a portion of the growth substrate.

28. The light source of claim 1 wherein the luminescent material structure is formed on the light emitting device.

* * * * *

UNITED STATES PATENT AND TRADEMARK OFFICE
CERTIFICATE OF CORRECTION

PATENT NO.    : 6,642,652 B2
DATED         : November 4, 2003
INVENTOR(S)   : William David Collins III, et al.

It is certified that error appears in the above-identified patent and that said Letters Patent is hereby corrected as shown below:

The sheets of drawings consisting of figures 4, 5A, 5B and 5C should be deleted to appear as per attached sheets.

Signed and Sealed this

Twentieth Day of April, 2004

JON W. DUDAS
*Acting Director of the United States Patent and Trademark Office*